(12) United States Patent  
Furuyama

(10) Patent No.: US 7,697,799 B2  
(45) Date of Patent: Apr. 13, 2010

(54) LIGHT RECEIVING DEVICE AND OPTICALLY INTERCONNECTED LSI

(75) Inventor: Hideto Furuyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 12/146,771

(22) Filed: Jun. 26, 2008

(65) Prior Publication Data

US 2009/0010593 A1    Jan. 8, 2009

(30) Foreign Application Priority Data

Jun. 26, 2007    (JP) ............................. 2007-167420

(51) Int. Cl.
*G02B 6/12* (2006.01)

(52) U.S. Cl. .................. 385/14; 385/129; 385/130; 385/131; 385/132; 385/27; 385/30; 385/39; 385/47; 385/49; 385/50

(58) Field of Classification Search ............ None
See application file for complete search history.

(56) References Cited

U.S. PATENT DOCUMENTS

| | | | |
|---|---|---|---|
| 6,307,827 B1 * | 10/2001 | Nishiwaki | 369/112.07 |
| 6,587,494 B2 | 7/2003 | Hatakoshi et al. | |
| 6,687,277 B2 | 2/2004 | Hatakoshi et al. | |
| 7,085,220 B2 | 8/2006 | Fujikata et al. | |
| 7,154,820 B2 | 12/2006 | Nakada et al. | |
| 7,245,808 B2 | 7/2007 | Sato et al. | |
| 2005/0064303 A1 | 3/2005 | Yamada et al. | |
| 2006/0011954 A1 * | 1/2006 | Ueda et al. | 257/291 |
| 2007/0146531 A1 * | 6/2007 | Toshikiyo | 348/340 |
| 2007/0253051 A1 * | 11/2007 | Ishihara et al. | 359/212 |
| 2007/0262405 A1 | 11/2007 | Furuyama | |

FOREIGN PATENT DOCUMENTS

JP    2001-189519    7/2001

OTHER PUBLICATIONS

Tsutomu Ishi, et al., "Si Nano-Photodiode with a Surface Plasmon Antenna", Japanese Journal of Applied Physics, 2005, vol. 44. No. 12. pp. L364-L366.

* cited by examiner

*Primary Examiner*—Uyen-Chau N Le  
*Assistant Examiner*—Chad H Smith  
(74) *Attorney, Agent, or Firm*—Oblon, Spivak, McClelland, Maier & Neustadt, L.L.P.

(57) ABSTRACT

A light receiving device includes a first receiving structure and a second receiving structure. The first receiving structure has a first concentric coupling periodic structure provided in a first surface of a conductive thin film formed on a substrate, a first opening located at a center of the first concentric coupling periodic structure, and a first light receiving section located at an opening end of the first opening. The second receiving structure has a second concentric coupling periodic structure provided in the first surface of the conductive thin film, a second opening located at a center of the second concentric coupling periodic structure, and a second light receiving section located at an opening end of the second opening. The second light receiving section is electrically isolated from the first light receiving section.

20 Claims, 6 Drawing Sheets

US 7,697,799 B2

LIGHT RECEIVING DEVICE AND OPTICALLY INTERCONNECTED LSI

CROSS-REFERENCE TO RELATED APPLICATIONS

This application is based upon and claims the benefit of priority from the prior Japanese Patent Application No. 2007-167420, filed on Jun. 26, 2007; the entire contents of which are incorporated herein by reference.

BACKGROUND OF THE INVENTION

The performance improvement of electronic devices such as bipolar transistors and field-effect transistors has dramatically increased the operating speed of large-scale integrated circuits (LSI). However, although achieving performance improvement, the downsizing of transistors has encountered a serious problem with electrical interconnection therebetween in relation to the increase of interconnect resistance and capacitance between interconnects, which is becoming a bottleneck in the improvement of LSI performance.

In view of the foregoing problem with electrical interconnection, some proposals have been made for an optically interconnected LSI, which includes optically interconnected components. Optical interconnection has little frequency dependence of loss at frequencies from DC to 100 GHz or more, and the interconnect path suffers from no electromagnetic interference, allowing interconnection at several 10 Gbps or more to be easily realized.

This type of intra-LSI optical interconnection requires a high-speed light receiving device made of silicon (Si), which is a LSI substrate material. In general, because Si is an indirect transition semiconductor, it has low light absorption efficiency, and it is difficult to satisfy both of high light absorption efficiency and high speed. To solve this, a light receiving device of the focusing antenna type based on surface plasmons traveling on the surface of a metal or other conductive material is known (Japanese Journal of Applied Physics, 2005, Vol. 44, No. 12, p. L364). On the other hand, to improve the light transmission efficiency of a small opening, a technique of using an asymmetric opening Is known (JP-A 2001-189519 (Kokai)).

SUMMARY OF THE INVENTION

According to an aspect of the invention, there is provided a light receiving device including: a first receiving structure having: a first concentric coupling periodic structure provided in a first surface of a conductive thin film formed on a substrate and configured to convert incident light to a surface plasmon; a first opening located at a center of the first concentric coupling periodic structure and penetrating the conductive thin film; and a first light receiving section located at an opening end of the first opening, the opening end being at a second surface opposite to the first surface; and a second receiving structure having: a second concentric coupling periodic structure provided in the first surface of the conductive thin film and configured to convert incident light to a surface plasmon, the second concentric coupling periodic structure having a period which is different from a period of the first concentric coupling periodic structure and overlapping the first concentric coupling periodic structure; a second opening located at a center of the second concentric coupling periodic structure and penetrating the conductive thin film, the second opening being located in a region in which the first and the second concentric coupling periodic structures overlap each other; and a second light receiving section located at an opening end of the second opening, the opening end being at the second surface, the second light receiving section being electrically isolated from the first light receiving section.

According to another aspect of the invention, there is provided an optically interconnected LSI including: a transistor device integrated on a semiconductor substrate; a multilayer interconnection provided on the transistor device; a first receiving structure having: a first concentric coupling periodic structure provided in a first surface of a conductive thin film formed on the multilayer interconnection and configured to convert incident light to a surface plasmon; a first opening located at a center of the first concentric coupling periodic structure and penetrating the conductive thin film; a first waveguide opening connected to the first opening and penetrating a conductor continuously provided in the multilayer interconnection; and a first semiconductor light receiving section provided at an opening end of the waveguide opening; and a second receiving structure having: a second concentric coupling periodic structure provided in the first surface of the conductive thin film and configured to convert incident light to a surface plasmon, the second concentric coupling periodic structure having a period which is different from a period of the first concentric coupling periodic structure and overlapping the first concentric coupling periodic structure so as to be included in an irradiation area of one incident light beam; a second opening located at a center of the second concentric coupling periodic structure and penetrating the conductive thin film, the second opening being located in a region in which the first and the second concentric coupling periodic structures overlap each other; and a second semiconductor light receiving section located at an opening end of the second opening, the opening end being at the second surface, the second semiconductor light receiving section being electrically isolated from the first semiconductor light receiving section.

DETAILED DESCRIPTION OF THE INVENTION

The interconnection capacity of optical interconnection can be increased by improving the interconnection speed and/or increasing the number of interconnects. On the other hand, use of wavelength multiplexing allows improvement of capacity without changing the interconnection speed and the number of interconnects. However, in the case of optical interconnection in a limited space such as intra-LSI interconnection, it is difficult to place therein a multiplexer and a demultiplexer for wavelength multiplexing, which substantially hinders application of wavelength multiplexing.

In wavelength-multiplexed optical interconnection, on the light transmitting side, the light emitting section of a semiconductor laser is small, and this allows a simple configuration in which semiconductor lasers with different wavelengths are closely placed and coupled to one optical line (optical fiber, optical waveguide, etc.). However, on the light receiving side, the light receiving section of a light receiving device needs to be as large as an optical waveguide. Hence, a configuration of receiving light after wavelength demultiplexing is typically used.

In contrast, according to the embodiment of the invention, as described below, a light receiving device having wavelength multiplexing capability is realized in an area for substantially one light receiving device. This allows wavelength-multiplexed optical transmission even in a limited space such as on an LSI chip.

The embodiment of the invention will now be described with reference to the drawings. Silicon (Si) is used as a specific material of the light receiving section in the description of this embodiment. However, this embodiment can also be practiced using materials such as Ge, SiGe, SiC, GaAs, InP, GaInAs, GaInAsP, and AlGaAs, as long as the light receiving section includes a material with light receiving (photoelectric conversion) capability, and the invention is not limited to the following embodiment. Furthermore, the following description will be made by extracting a light receiving device (optical interconnection receiving section) corresponding to one optical interconnect. However, it is understood that this is intended to integrate numerous optical interconnects on an LSI chip, and the number of integrated light receiving devices and optical interconnects is arbitrary.

Figure 1:
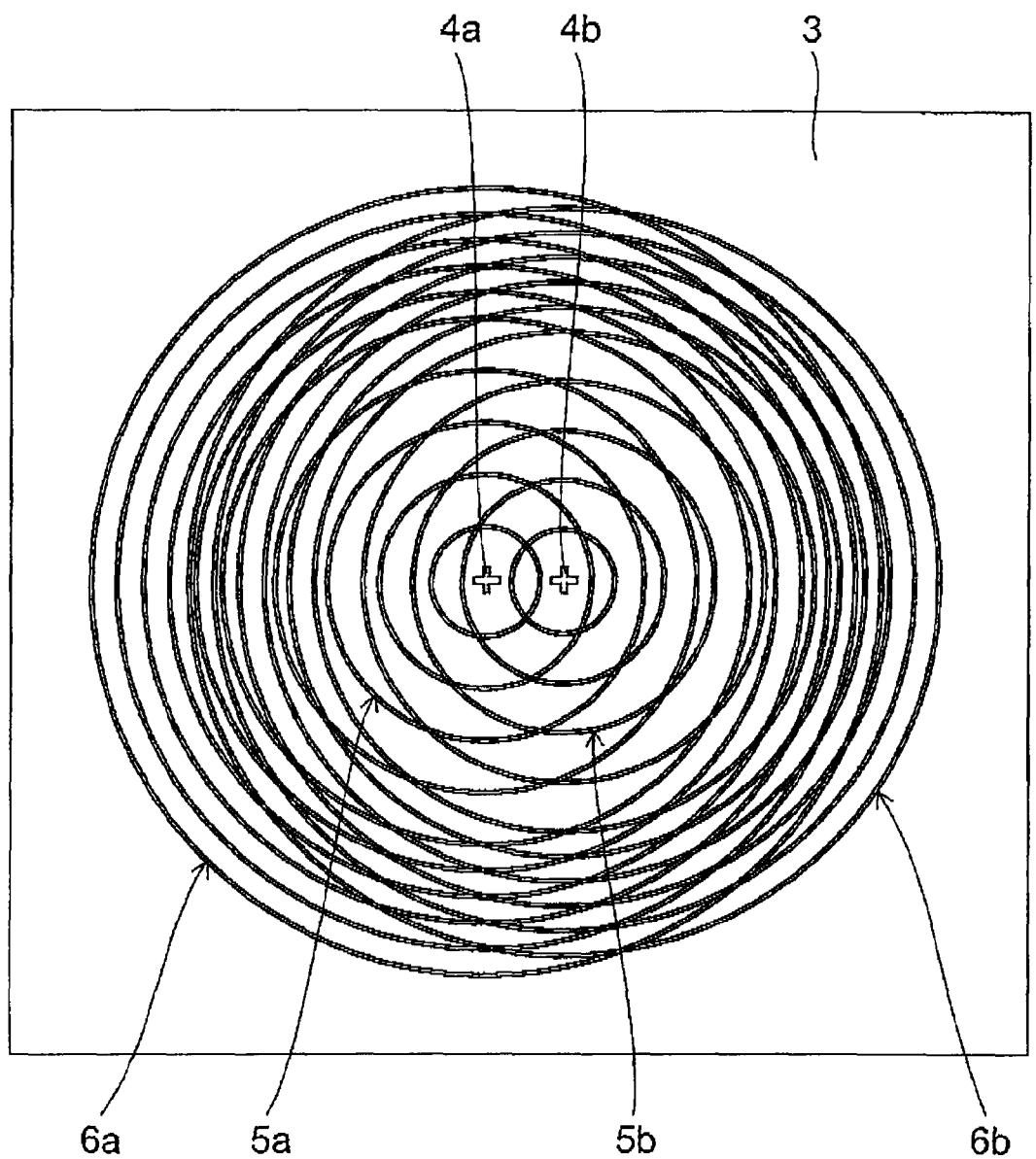
FIG. 1 is a plane view showing a specific example including two openings and periodic structures which are in one-to-one correspondence with the openings in a light receiving device according to an embodiment.

FIG. 1 illustrates a planar structure of a light receiving device according to this embodiment. In this example, two openings 4a, 4b, two concentric coupling periodic structures (hereinafter also simply referred to as coupling periodic structures) 5a, 5b, and two concentric reflecting periodic structures (hereinafter also simply referred to as reflecting periodic structures) 6a, 6b are provided on the same semiconductor substrate.

The two coupling periodic structures 5a, 5b, which are in one-to-one correspondence with the openings 4a, 4b, respectively, overlap each other. Likewise, the two reflecting periodic structures 6a, 6b, which are in one-to-one correspondence with the openings 4a, 4b, respectively, also overlap each other. Each opening 4a, 4b is located at the center of one of the coupling periodic structures 5a, 5b, and placed in a region where the coupling periodic structures 5a, 5b overlap each other. The overlapping area of all the periodic structures including the reflecting periodic structures 6a, 6b located outside has nearly the same size as the irradiation area of one incident light beam. The overlapping region of the two coupling periodic structures 5a, 5b, which is a constituent part required for wavelength-selective light reception, and the two openings 4a, 4b are located in the irradiation area of an incident light beam.

Figure 2:
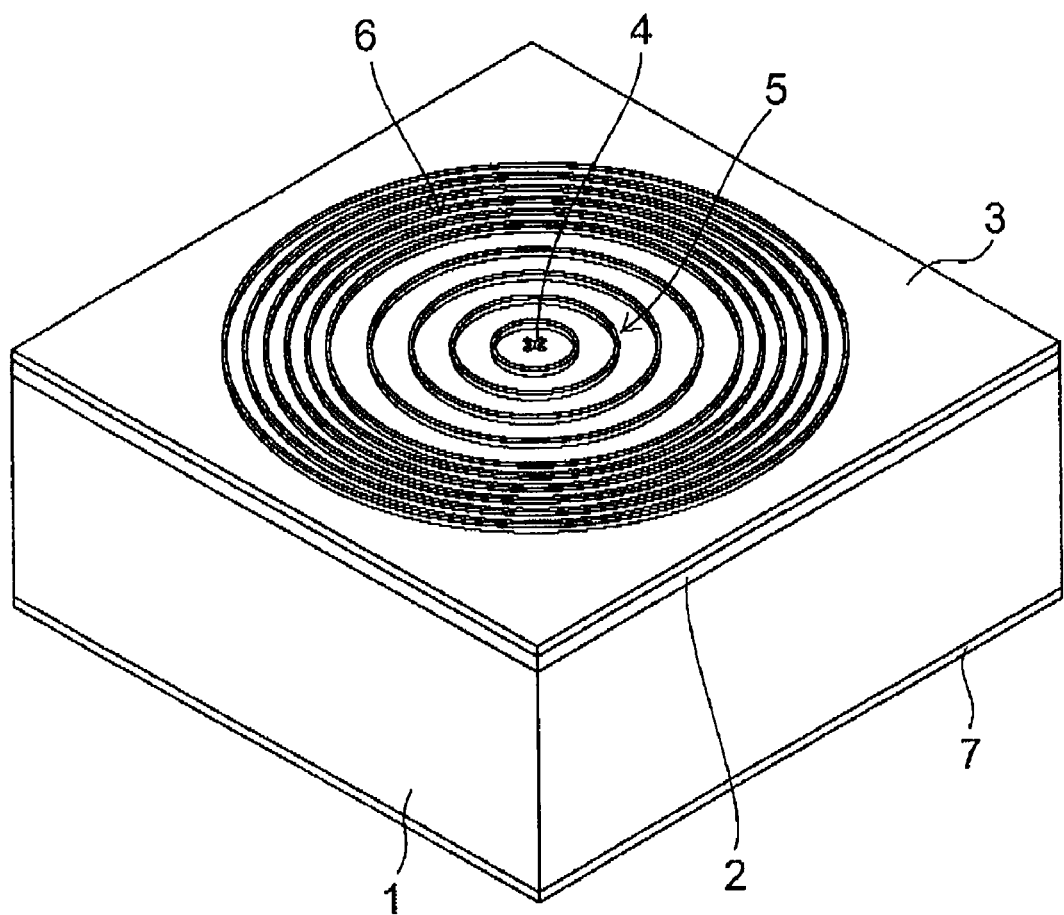
FIG. 2 is a schematic perspective view extracting and showing one opening and one periodic structure in one-to-one correspondence therewith of a plurality of openings and periodic structures in FIG. 1.
Figure 3:
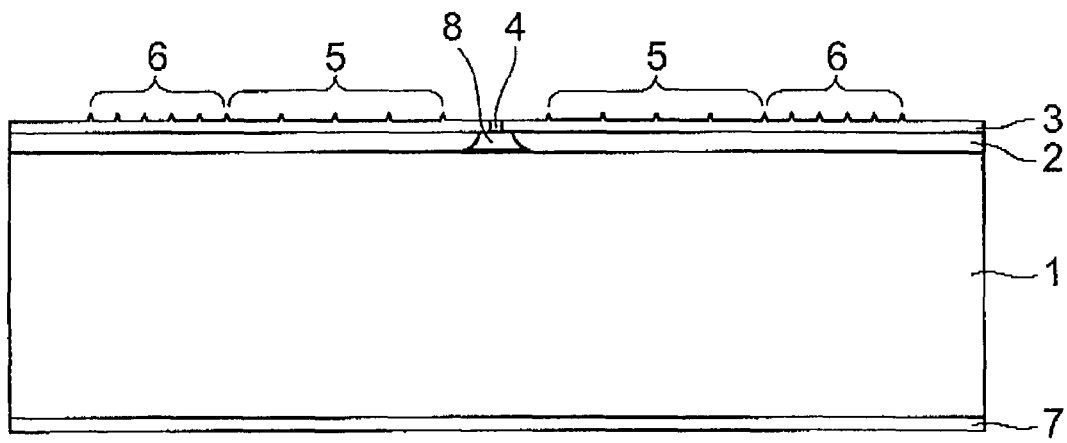
FIG. 3 is a cross-sectional view of the structure shown in FIG. 2.
Figure 4:
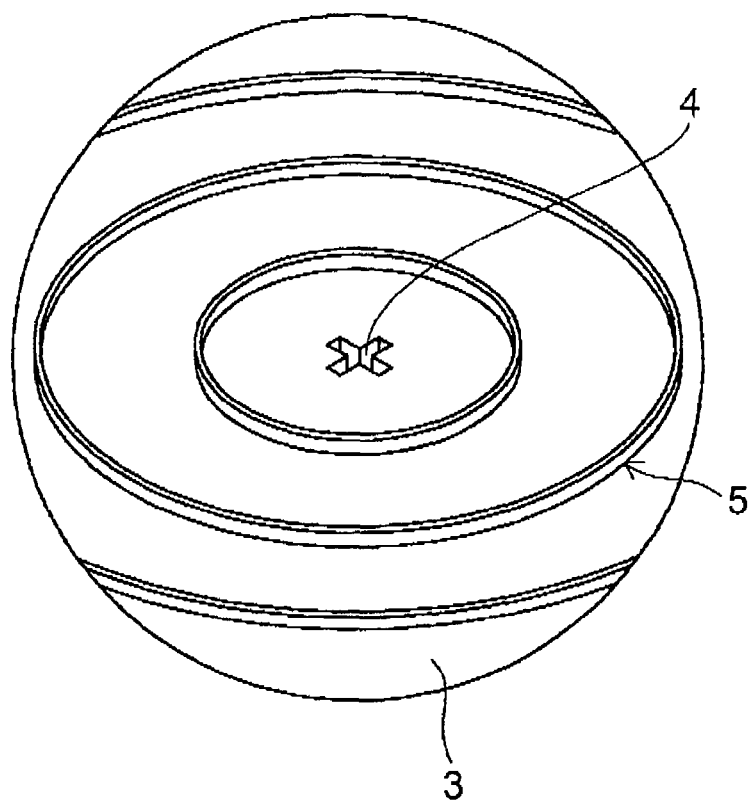
FIG. 4 is a principal enlarged view of the structure shown in FIG. 2.
Figure 5:
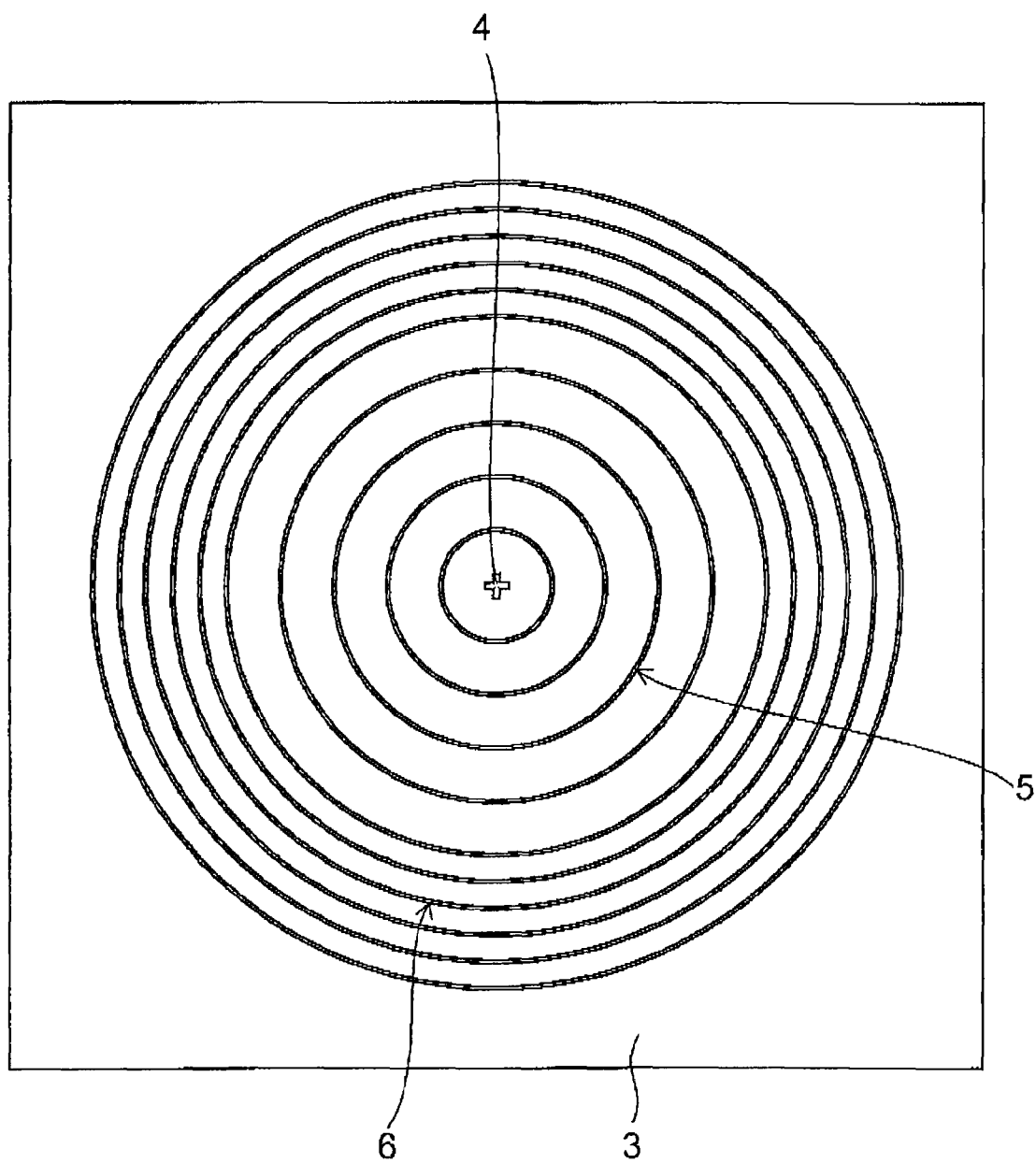
FIG. 5 is a plane view of the structure shown in FIG. 2.

Here, to make the description more understandable, FIGS. 2 to 5 extract and show only an element including the opening 4a and the periodic structures 5a, 6a in one-to-one correspondence therewith, or an element including the opening 4b and the periodic structures 5b, 6b in one-to-one correspondence therewith, FIG. 2 is a schematic perspective view of the element, FIG. 3 is a cross-sectional view thereof, FIG. 4 is a principal enlarged view thereof, and FIG. 5 is a plan view thereof. That is, the opening 4 in FIGS. 2 to 5 corresponds to the opening 4a or 4b in FIG. 1, the coupling periodic structure 5 in FIGS. 2 to 5 corresponds to the coupling periodic structure 5a or 5b in FIG. 1, and the reflecting periodic structure 6 in FIGS. 2 to 5 corresponds to the reflecting periodic structure 6a or 6b in FIG. 1.

A passivation film (e.g., $SiO_2$ film) 2 is formed on a semiconductor substrate (e.g., n-type silicon substrate) 1, and a conductive thin film 3 is formed on the passivation film 2. In the surface of the conductive thin film 3, a coupling periodic structure 5 for converting (coupling) incident light to surface plasmons, a cruciform opening 4 located at the center of the coupling periodic structure 5, and a reflecting periodic structure 6 formed outside the coupling periodic structure 5 and configured to Bragg-reflect the outward (radially outward of the coupling periodic structure 5) diverging components of the surface plasmons coupled to the incident light and turn them back to the inside (toward the opening 4). A backside electrode 7 illustratively made of aluminum is provided on the backside (on the side opposite to the surface provided with the conductive thin film 3) of the semiconductor substrate 1. The coupling periodic structure 5 and the reflecting periodic structure 6 are illustratively formed as a projection-depression pattern obtained by processing the surface of the conductive thin film 3.

The conductive thin film 3 can be illustratively made of a metal such as Ag, Au, Cu, Al, Ni, Pd, Pt, W, Ti, Cr, and Mo formed by sputtering or heated evaporation. Here, an Ag film is used as an example of the conductive thin film 3, and its thickness is illustratively 100 nm.

As shown in FIG. 3, the opening 4 penetrates to the backside of the conductive thin film 3, and at its opening end on the side opposite to the surface provided with the periodic structures 5, 6 is provided a light receiving section (photoelectric conversion section) 8 illustratively made of n-type silicon. That is, an n-type region having a lower concentration than the other portion is formed as a light receiving section 8 on the surface of the semiconductor substrate 1 below the opening 4. Two light receiving sections 8 are provided in one-to-one correspondence with the two openings 4a, 4b shown in FIG. 1, respectively, and are electrically isolated from each other.

Light incident on a metal film having a hole (opening) smaller than its wavelength can hardly be transmitted therethrough. However, it is known that the transmitted light intensity can be significantly enhanced by providing periodic projections and depressions around the small hole to couple the incident light to surface plasmons of the metal film, thereby producing resonance.

To this end, the coupling periodic structure 5 and the reflecting periodic structure 6 need to be formed with a period (pitch) matched with the wavelength of light to be received, and are formed concentrically about the opening 4 as shown in FIG. 5. Let λ denote the received light wavelength, $\in 1$ the dielectric constant of the conductive thin film 3, and $\in 2$ the dielectric constant of the substance in contact with the conductive thin film 3. Then the period Pc of the coupling periodic structure 5 is approximated as $Pc \approx \lambda(1/\in 1 + 1/\in 2)^{1/2}$. The period Pb of the reflecting periodic structure 6 can be Pb=Pc/2.

For example, a focused ion beam (FIB) system is used to form concentric periodic structures 5, 6 with a depth of 50 nm in the surface of the conductive thin film (Ag film having a thickness of 100 nm) 3. In the case where the surface of the conductive thin film 3 is in contact with air, the period Pc of the coupling periodic structure 5 is 840 nm (the period Pb of the reflecting periodic structure 6 is 420 nm). In the case where an $SiO_2$ passivation film having a thickness of approximately 1 μm is formed on the surface of the conductive thin film 3, Pc is 560 nm (Pb=280 nm). Then the receivable center wavelength λ is in the vicinity of 850 nm.

The planar size of the opening 4 is minimized so that the light receiving section 8 for photoelectric conversion of light is confined to a sufficiently small region. As a standard therefor, the end-to-end distance (top length) of the cruciform opening 4 is made larger than half the plasmon wavelength, and the groove width (line width) of the cruciform is made smaller than half the plasmon wavelength. Strictly speaking, the plasmon wavelength λp is the plasmon wavelength inside the opening 4. However, it is comparable to the period Pc of the coupling periodic structure 5 described above (corresponding to the plasmon wavelength on the surface of a plasmon focusing antenna). Hence, the short side length of the opening 4 can be considerably smaller than Pc/2 as long as the long side length is Pc/2 or more.

For example, for the receivable center wavelength λ≈850 nm described above, in the case where an $SiO_2$ passivation film having a thickness of approximately 1 μm is formed on the surface of the conductive thin film 3, the long side length of the opening 4 is 280 nm or more (e.g., 400 nm), and the short side length is 280 nm or less (e.g., 50 nm). As a matter of course, the opening 4 is a hole penetrating the conductive thin film 3, and in the above example (Ag film having a thickness of 100 nm), it can be formed by using a focused ion beam to dig a cruciform groove having a top length of 400 nm and a groove width of 50 nm to a depth of 100 nm or more. By this configuration, the propagation loss in the opening 4 can be reduced, and plasmon attenuation in the opening 4 can be significantly reduced even in the case where only the opening 4 is thickly formed.

For example, in the case where the opening 4 has a thickness (opening length) of 100 nm and the cruciform has a top length of 400 nm and a groove width of 50 nm, the transmittance is estimated to be approximately 97%. For a circular opening (with a diameter of approximately 220 nm) having the same area as this cruciform opening 4, the transmittance is estimated to be 16%, which is considerably smaller. In the case of a circular opening, the opening needs to have a very small thickness or a large opening diameter. For example, if the above circular opening has a thickness of 1 μm, the transmittance is $2 \times 10^{-9}$, which is extremely small. However, in the case of the cruciform opening 4, the transmittance only decreases to 75%. In the case where the opening has a thickness of 1 μm, the circular opening needs to have an opening diameter of 400 nm or more. In this case, the transmittance can reach approximately 90%, but the opening area is larger than that of the cruciform opening by a factor of three or more, which causes the problem of decreasing the response rate of the light receiving device.

In the case of the cruciform opening 4, for incident light with any polarization direction, the polarization components are split between the slits of the cruciform (equivalent to orthogonal slits) in favor of higher transmittance, and each component is transmitted through one of the two slits. Thus the incident light is transmitted through the opening 4 irrespective of its polarization direction. This is comparable to polarization independence similar to that of a circular opening, and the cruciform opening 4 can respond more rapidly by the decreased area of the opening.

For example, consider the following structure. A Ti film is formed with a thickness of 10 nm as a Schottky electrode for the light receiving section 8 made of low-concentration n-type silicon and as an adhesion metal for adhesion to the passivation film ($SiO_2$ film) 2. An Ag film is formed with a thickness of 100 nm as a conductive thin film 3 on the Ti film. The cruciform opening 4 has a top length of 400 nm and a groove width of 50 nm. The coupling periodic structure 5 includes ten periods with a depth of 50 nm, and the reflecting periodic structure 6 located outside it includes five periods with a depth of 50 nm.

Then, for a received light wavelength of 850 nm, the periodic structure has a diameter of approximately 14 μm in the case of a device with $SiO_2$ passivation (Pc=560 nm). The light receiving diameter for incident light is approximately 11 μm, allowing light transmitted by a single-mode optical fiber to be received by butt-joint coupling. The light receiving section (low-concentration n-type silicon region) 8 has a thickness of e.g. 2 μm, and the passivation film 2 defining the light receiving region is illustratively formed by thermal oxidation. This configuration allows a light receiving device with characteristics such as a light receiving efficiency of approximately 10% (a photoelectric conversion coefficient of 0.08 A/W) and a response rate of 15 GHz or more.

Returning to FIG. 1, this embodiment is configured so that the receivable wavelength of the periodic structures 5a, 6a about the first opening 4a is different from the receivable wavelength of the periodic structures 5b, 6b about the second opening 4b. That is, the periods of the periodic structures 5a, 6a, 5b, 6b are different from each other. Interference between the two plasmon focusing antennas can be prevented by providing some separation the light receiving wavelengths.

For example, assuming that a passivation film ($SiO_2$ film) having a thickness of approximately 1 μm is formed on the surface of the conductive thin film 3, the coupling periodic structure 5a about the first opening 4a has a period of 560 nm, the reflecting periodic structure 6a about the first opening 4a has a period of 280 nm, the coupling periodic structure 5b about the second opening 4b has a period of 540 nm, and the reflecting periodic structure 6b about the second opening 4b has a period of 270 nm. This allows the first opening 4a and the second opening 4b to receive light with a wavelength of 850 nm and 820 nm, respectively.

The spacing (separation distance) between the first opening 4a and the second opening 4b is illustratively 800 nm. The coupling periodic structure 5a, 5b has a diameter of approximately 10 μm. Thus the two light receiving devices are located nearly at the same position, and there is a large overlap between the focusing antennas (periodic structures). Hence, by simply irradiating the focusing antennas with one incident light beam (e.g., output of a single-mode optical fiber having a beam diameter of approximately 10 μm), the light receiving openings 4a, 4b can be automatically switched in accordance with the wavelength of the incident light. That is, wavelength-demultiplexed reception can be achieved by simply irradiating one optical input section (the region including the two openings 4a, 4b where the two coupling periodic structures 5a, 5b overlap each other) with light including two multiplexed wavelengths. This realizes the construction of a wavelength-selective light receiving device array in space for one light receiving device.

Figure 6:
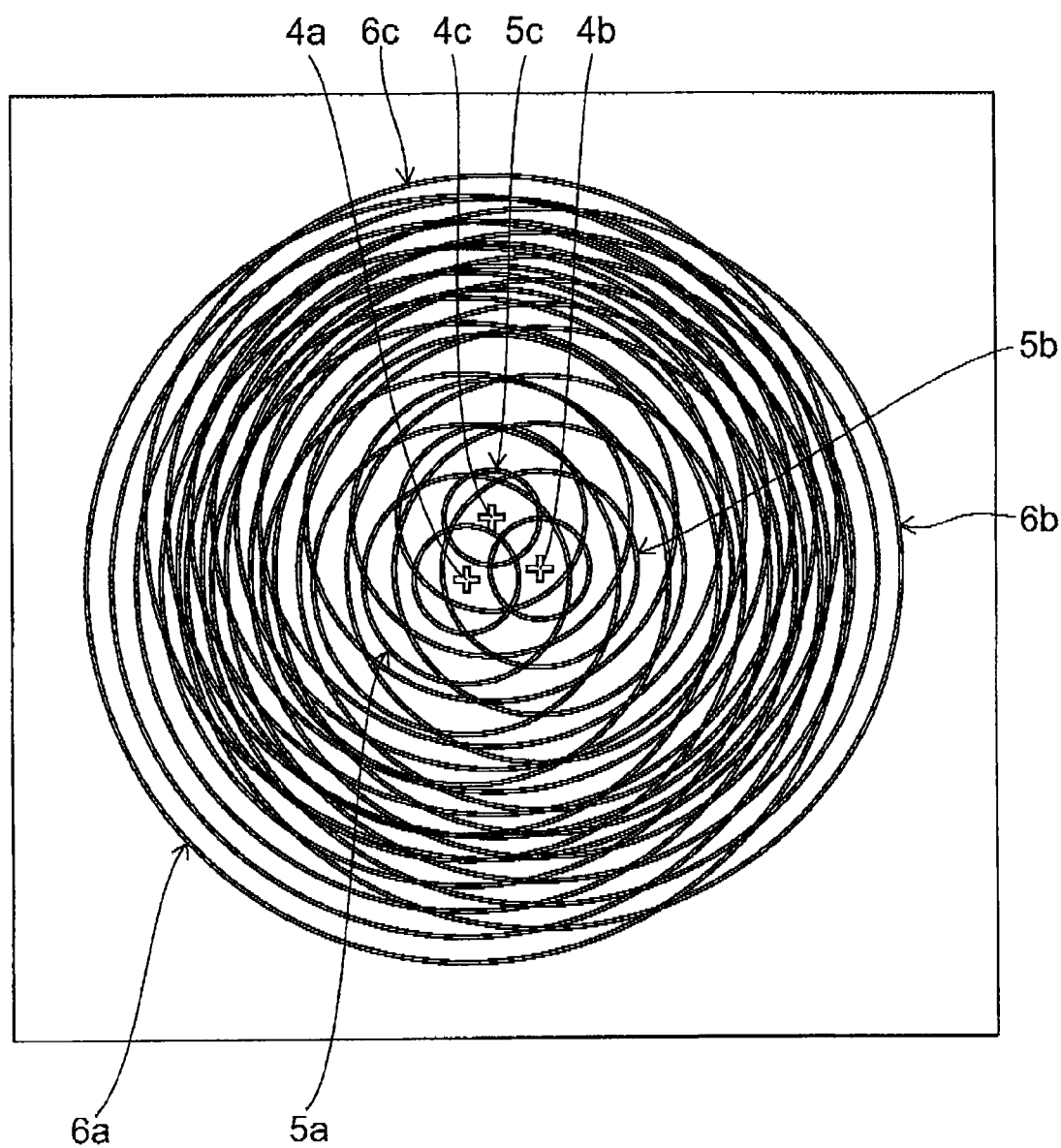
FIG. 6 is a plane view showing a specific example including three openings and periodic structures in one-to-one correspondence therewith in the light receiving device according to the embodiment.

FIG. 6 shows a configuration that allows light including three different wavelengths to be selectively received. In this example, three openings 4a, 4b, 4c, three coupling periodic structures 5a, 5b, 5c, and three reflecting periodic structures 6a, 6b, 6c are provided on the same semiconductor substrate.

The three coupling periodic structures 5a, 5b, 5c, which are in one-to-one correspondence with the openings 4a, 4b, 4c, respectively, overlap each other. Likewise, the three reflecting periodic structures 6a, 6b, 6c, which are in one-to-one correspondence with the openings 4a, 4b, 4c, respectively, also overlap each other. Each opening 4a, 4b, 4c, which is located at the center of one of the coupling periodic structures 5a, 5b, 5c, is placed in a region where the coupling periodic structures 5a, 5b, 5c overlap each other. The overlapping area of all the periodic structures including the reflecting periodic structures 6a, 6b, 6c located outside has nearly the same size as the irradiation area of one incident light beam. The overlapping region of the coupling periodic structures 5a, 5b, 5c, which is a constituent part required for wavelength-selective light reception, and the openings 4a, 4b, 4c are located in the irradiation area of an incident light beam. Three light receiving sections 8 (FIG. 3) are provided in one-to-one correspondence with the three openings 4a, 4b, 4c, respectively, and are electrically isolated from each other.

The coupling periodic structures 5a, 5b, 5c corresponding respectively to the first to third opening 4a, 4b, 4c have a period of e.g. 560 nm, 550 nm, and 540 nm, respectively. The period of the reflecting periodic structures 6a, 6b, 6c corresponding respectively to the first to third opening 4a, 4b, 4c is half that of the corresponding coupling periodic structure 5a, 5b, 5c. Consequently, the first to third opening 4a, 4b, 4c have a receiving wavelength of 850 nm, 835 nm, and 820 nm, respectively, allowing selective reception of three different wavelengths. It is noted that four or more openings as well as four or more coupling periodic structures, four or more reflecting periodic structures, and four or more light receiving sections corresponding respectively to the openings can be provided on the same semiconductor substrate to allow selective reception of a larger number of different wavelengths.

As described above, according to this embodiment, a plurality of openings for receiving light are closely located to constitute a light receiving device array, and plasmon focusing antennas overlapping each other are formed in association therewith. Furthermore, each plasmon focusing antenna is provided with a different resonant frequency (period of the periodic structure). Thus, interference between the plasmon focusing antennas is prevented, and a different one of the openings is used for each wavelength to allow wavelength-multiplexed light reception.

Thus, a plurality of light receiving devices can be located in an area for one typical light receiving device. Furthermore, each light receiving device selectively receives a different wavelength. Hence the function of a wavelength demultiplexer and a light receiving device array is realized in an area for one light receiving device. That is, this embodiment realizes a wavelength-selective light receiving device array using substantially one device, achieving wavelength-multiplexed optical interconnection without the need for an extra space. This allows effective construction of high-speed optical interconnection in an LSI chip, which facilitates increasing the speed and performance of the LSI and significantly contributes to the sophistication of information and communication equipment.

Wavelength-selective reception using one incident light beam can be realized if the overlapping region of a plurality of coupling periodic structures 5, which also includes a plurality of openings 4, is irradiated with the incident light beam. The region does not need to be entirely included in the irradiation area of the incident light beam. Wavelength-selective reception using one incident light beam can be also realized by a configuration in which the overlapping region of a plurality of coupling periodic structures 5, which also includes a plurality of openings 4, partly overlaps the irradiation area of the incident light beam. However, in this case, the incident light not impinging on the overlapping region of the plurality of coupling periodic structures 5 is not received, but wasted. Hence, from the viewpoint of increasing the light receiving efficiency, it is preferable that a plurality of coupling periodic structures 5 overlap each other so as to be included in the irradiation area of one incident light beam.

Figure 7:
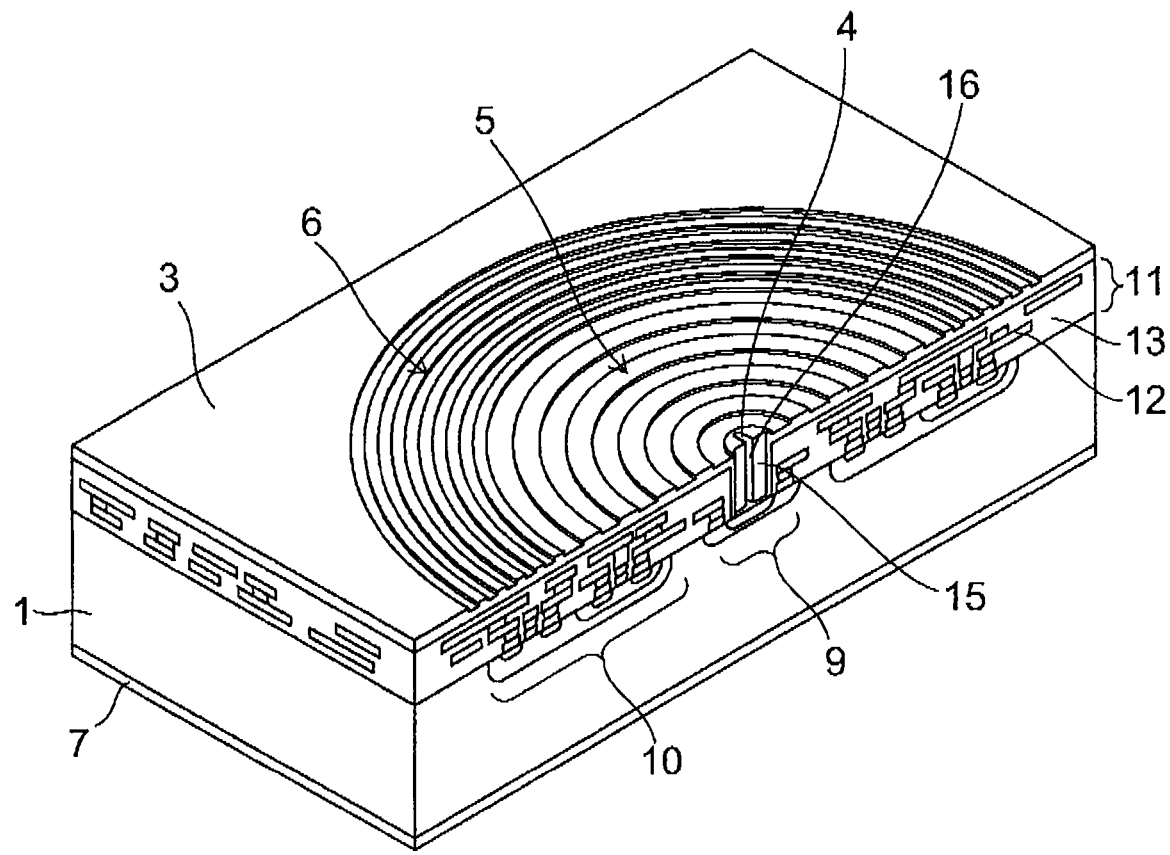
FIG. 7 is a cross-sectional perspective view showing a main part of an optically interconnected LSI according to the embodiment.

FIG. 7 is a cross-sectional perspective view showing the main part of an optically interconnected LSI according to the embodiment of the invention. The optically interconnected LSI of this example is configured using the polarization-independent light receiving device having cruciform openings described above. To make the description more understandable, FIG. 7, like FIGS. 2 to 5, extracts and shows one opening 4, as well as one coupling periodic structure 5, one reflecting periodic structure 6, and one light receiving section 9 corresponding to the opening 4. However, these are each replicated as described above with reference to FIGS. 1 and 6.

A transistor device (e.g., CMOS) 10 is integrally formed in the surface of a semiconductor substrate 1. A light receiving section (photoelectric conversion section) 9 is also formed in the surface of the semiconductor substrate 1. A multilayer interconnection 11 is formed on the surface of the semiconductor substrate 1. The multilayer interconnection 11 includes an interconnect 12, which is illustratively made of copper and connected to the transistor device 10 and the light receiving section 9, and an interlayer insulating film 13 illustratively made of silicon oxide.

A conductive thin film 3 is formed on (the interlayer insulating film 13 of) the multilayer interconnection 11, and a focusing antenna (coupling periodic structure 5, reflecting periodic structure 6) described above is formed in the surface of the conductive thin film 3. A cruciform opening 4 penetrating the conductive thin film 3 is formed at the center of the coupling periodic structure 5 and the reflecting periodic structure 6.

The opening 4 is connected to (in communication with) a waveguide opening 16, which is formed through a conductor 15 continuously provided in the multilayer interconnection 11 along its thickness. More specifically, below the opening 4, a conductor 15 thicker than the focusing antenna extends from the conductive thin film 3 to the light receiving section 9 in the surface of the semiconductor substrate 1. The light receiving section (photoelectric conversion section) 9 is disposed at the opening end of the waveguide opening 16 (the opening end located on the side opposite to the opening 4). Surface plasmons from the plasmon focusing antenna penetrate the multilayer interconnection 11 through the opening 4 and the waveguide opening 16 and propagate to the light receiving section 9.

The opening 4 is cruciform as in the above embodiment. The waveguide opening 16 connected to the opening 4 and penetrating the multilayer interconnection 11 is also shaped like a cruciform. Thus, without occupying a large layout area like a cylindrical metal pillar, the conductor 15 constituting a waveguide for surface plasmons can be embedded in a gap that exists in the multilayer interconnection 11 and at the boundary between the sections of the transistor layout. The metal pillar (conductor 15) including the cruciform waveguide opening 16 can be illustratively made of copper (Cu) like the interconnect 12 of the multilayer interconnection 11, but the plasmon absorption loss thereof is slightly high. Hence, if possible, it is preferable to use silver (Ag). In this case, for example, after the process for the multilayer interconnection 11 is completed, a cruciform groove penetrating the interlayer insulating film 13 of the multilayer interconnection 11 and some interconnect (such as a bias line for the light receiving device) is provided and filled with Ag by plating to form a cruciform metal pillar. Subsequently, a plasmon focusing antenna can be formed, and a cruciform opening 4 and a waveguide opening 16 can be formed by dry etching.

The multilayer interconnection of an LSI typically has a thickness of approximately 10 μm. Thus the plasmon transmission distance in the cruciform opening 4 and the waveguide opening 16 is around 10 μm. This is different from the transmission that only penetrates the conductive thin film 3 in the above embodiment, and it is preferable to prepare the opening 4 and the waveguide opening 16 with some allowance in size in order to reduce transmission loss. For example, if a plasmon is transmitted over 10 μm in an Ag waveguide made of an Ag metal pillar in which a cruciform opening 4 and a waveguide opening 16 are formed with a top length of 450 nm and a groove width of 200 nm, then a transmission efficiency of approximately 20% is achieved for incident light with a wavelength of 850 nm. The opening area (light receiving area) in this case is comparable to the area of a circular opening having a diameter of 420 nm, and does not amount to decreasing the response rate of the light receiving device from approximately 15 GHz.

Hence, in this embodiment, surface plasmons can be directly transmitted from the top of the LSI multilayer interconnection to the silicon substrate surface with only a loss of approximately −7 dB, which can be sufficiently recovered by the gain of only one or two transistors Conversely, this embodiment provides the effect of being able to realize rapid operation based on optical interconnection (e.g., 10-GHz clock) without degradation in waveforms and increase of excessive jitters. It is understood that the optically interconnected LSI according to this embodiment also includes a plurality of openings as well as periodic structures and light receiving sections in one-to-one correspondence with the openings as described above with reference to FIGS. 1 and 6, allowing wavelength-selective multiplexed reception.

The embodiment of the invention has been described with reference to the examples. However, the invention is not limited thereto, but can be variously modified within the spirit of the invention. For example, the specific numerical values of the period, wavelength, and other parameters as well as the materials described above are illustratively only, and can be suitably configured or selected within the spirit of the invention.

The invention claimed is:

1. A light receiving device comprising:
a first receiving structure having;
a first concentric coupling periodic structure provided in a first surface of a conductive thin film formed on a substrate and configured to convert incident light to a surface plasmon;
a first opening located at a center of the first concentric coupling periodic structure and penetrating the conductive thin film; and
a first light receiving section located at an opening end of the first opening, the opening end being at a second surface opposite to the first surface; and
a second receiving structure having:
a second concentric coupling periodic structure provided in the first surface of the conductive thin film and configured to convert incident light to a surface plasmon, the second concentric coupling periodic structure having a period which is different from a period of the first concentric coupling periodic structure and overlapping the first concentric coupling periodic structure;
a second opening located at a center of the second concentric coupling periodic structure and penetrating the conductive thin film, the second opening being located in a region in which the first and the second concentric coupling periodic structures overlap each other; and
a second light receiving section located at an opening end of the second opening, the opening end being at the second surface, the second light receiving section being electrically isolated from the first light receiving section.

2. The light receiving device according to claim 1, wherein the opening is shaped like a cruciform having a top length larger than half a surface plasmon wavelength and a groove width smaller than half the surface plasmon wavelength.

3. The light receiving device according to claim 1, wherein the plurality of concentric coupling periodic structures overlap each other so as to be included in an irradiation area of one incident light beam.

4. The light receiving device according to claim 1, wherein the plurality of concentric coupling periodic structures are each formed as a projection-depression pattern in the conductive thin film surface.

5. The light receiving device according to claim 1, wherein the plurality of concentric coupling periodic structures are each formed with a period matched with the wavelength of light to be received by the associated light receiving section.

6. The light receiving device according to claim 1, further comprising:
a concentric reflecting periodic structure provided outside each of the plurality of concentric coupling periodic structures in the conductive thin film surface and configured to reflect an outward diverging component of the surface plasmon toward the opening.

7. The light receiving device according to claim 6, wherein the plurality of concentric reflecting periodic structures are each formed as a projection-depression pattern in the conductive thin film surface.

8. The light receiving device according to claim 6, wherein the plurality of concentric reflecting periodic structures have different periods and overlap each other.

9. The light receiving device according to claim 1, wherein the substrate is a silicon substrate.

10. The light receiving device according to claim 1, wherein the light receiving section contains silicon.

11. An optically interconnected LSI comprising:
a transistor device integrated on a semiconductor substrate;
a multilayer interconnection provided on the transistor device;
a first receiving structure having:
a first concentric coupling periodic structure provided in a first surface of a conductive thin film formed on the multilayer interconnection and configured to convert incident light to a surface plasmon;
a first opening located at a center of the first concentric coupling periodic structure and penetrating the conductive thin film;
a first waveguide opening connected to the first opening and penetrating a conductor continuously provided in the multilayer interconnection; and
a first semiconductor light receiving section provided at an opening end of the waveguide opening; and
a second receiving structure having:
a second concentric coupling periodic structure provided in the first surface of the conductive thin film and configured to convert incident light to a surface plasmon, the second concentric coupling periodic structure having a period which is different from a period of the first concentric coupling periodic structure and overlapping the first concentric coupling periodic structure so as to be included in an irradiation area of one incident light beam;

a second opening located at a center of the second concentric coupling periodic structure and penetrating the conductive thin film, the second opening being located in a region in which the first and the second concentric coupling periodic structures overlap each other; and a second semiconductor light receiving section located at an opening end of the second opening, the opening end being at the second surface, the second semiconductor light receiving section being electrically isolated from the first semiconductor light receiving section.

12. The optically interconnected LSI according to claim 11, wherein the opening is shaped like a cruciform having a top length larger than half a surface plasmon wavelength and a groove width smaller than half the surface plasmon wavelength.

13. The optically interconnected LSI according to claim 11, wherein the plurality of concentric coupling periodic structures are each formed as a projection-depression pattern in the conductive thin film surface.

14. The optically interconnected LSI according to claim 11, wherein the plurality of concentric coupling periodic structures are each formed with a period matched with the wavelength of light to be received by the associated light receiving section.

15. The optically interconnected LSI according to claim 11, further comprising:

a concentric reflecting periodic structure provided outside each of the plurality of concentric coupling periodic structures in the conductive thin film surface and configured to reflect an outward diverging component of the surface plasmon toward the opening.

16. The optically interconnected LSI according to claim 15, wherein the plurality of concentric reflecting periodic structures are each formed as a projection-depression pattern in the conductive thin film surface.

17. The optically interconnected LSI according to claim 15, wherein the plurality of concentric reflecting periodic structures have different periods and overlap each other.

18. The optically interconnected LSI according to claim 11, wherein the semiconductor substrate is a silicon substrate.

19. The optically interconnected LSI according to claim 11, wherein the light receiving section contains silicon.

20. The optically interconnected LSI according to claim 11, wherein the waveguide opening is shaped like a cruciform.

* * * * *